(12) United States Patent
Miyata

(10) Patent No.: US 12,136,684 B2
(45) Date of Patent: Nov. 5, 2024

(54) METHOD FOR MANUFACTURING LIGHT EMITTING APPARATUS, LIGHT EMITTING APPARATUS, AND PROJECTOR

(71) Applicant: Seiko Epson Corporation, Tokyo (JP)

(72) Inventor: Takashi Miyata, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 63 days.

(21) Appl. No.: 17/536,139

(22) Filed: Nov. 29, 2021

(65) Prior Publication Data

US 2022/0173266 A1 Jun. 2, 2022

(30) Foreign Application Priority Data

Nov. 30, 2020 (JP) .................. 2020-198137

(51) Int. Cl.
*H01L 33/04* (2010.01)
*G03B 21/20* (2006.01)
*H01L 33/00* (2010.01)

(52) U.S. Cl.
CPC ........ *H01L 33/005* (2013.01); *G03B 21/2006* (2013.01); *H01L 33/04* (2013.01); *H01L 2933/0083* (2013.01)

(58) Field of Classification Search
CPC ............ G03B 21/2006; G03B 21/2033; H01L 2933/0016; H01L 2933/005; H01L 2933/0083; H01L 33/005; H01L 33/04; H01L 33/08; H01L 33/20; H01L 33/36
See application file for complete search history.

(56) References Cited

U.S. PATENT DOCUMENTS

2018/0198047 A1* 7/2018 Danesh .................. H01L 33/60
2020/0373731 A1 11/2020 Noda
2022/0311205 A1 9/2022 Noda

FOREIGN PATENT DOCUMENTS

JP 2010-135858 A 6/2010
JP 2019-029513 A 2/2019

* cited by examiner

*Primary Examiner* — Matthew C Landau
*Assistant Examiner* — Dmitriy Yemelyanov
(74) *Attorney, Agent, or Firm* — Harness, Dickey & Pierce, P.L.C.

(57) ABSTRACT

A method for manufacturing a light emitting apparatus according to an aspect of the present disclosure includes forming a light emitting section on a substrate, the light emitting section including a group of columnar sections formed of a plurality of columnar sections each including a light emitting layer, forming a first insulating layer on the substrate so as to cover the light emitting section, etching the tip of a protrusion-shaped section that contains the same substance as the substance of which the light emitting section is made and protrudes beyond the first insulating layer, forming a second insulating layer on the first insulating layer, and forming an electrode to be electrically coupled to the light emitting section on the second insulating layer.

8 Claims, 4 Drawing Sheets

METHOD FOR MANUFACTURING LIGHT EMITTING APPARATUS, LIGHT EMITTING APPARATUS, AND PROJECTOR

The present application is based on, and claims priority from JP Application Serial Number 2020-198137, filed Nov. 30, 2020, the disclosure of which is hereby incorporated by reference herein in its entirety.

BACKGROUND

1. Technical Field

The present disclosure relates to a method for manufacturing a light emitting apparatus, a light emitting apparatus, and a projector.

2. Related Art

JP-A-2010-135858 discloses a semiconductor light emitting device including a plurality of nanocolumns provided on a substrate.

In the semiconductor light emitting device described above, after formation of the plurality of nanocolumns on the substrate, extra nanocolumns formed in an area outside the light emitting area are removed in a patterning process. However, the residue produced in an etching process forms, for example, irregularities on the substrate. When an insulating layer is formed on such irregularities, short circuits occur in the wiring formed on the insulating layer and reduce the reliability of electrical coupling.

SUMMARY

To solve the problem described above, according to an aspect of the present disclosure, there is provided a method for manufacturing a light emitting apparatus, the method including forming a light emitting section on a substrate, the light emitting section including a group of columnar sections formed of a plurality of columnar sections each including a light emitting layer, forming a first insulating layer on the substrate so as to cover the light emitting section, etching a tip of a protrusion-shaped section that contains the same substance as a substance of which the light emitting section is made and protrudes beyond the first insulating layer, forming a second insulating layer on the first insulating layer, and forming an electrode to be electrically coupled to the light emitting section on the second insulating layer.

According to another aspect of the present disclosure, there is provided a light emitting apparatus including a substrate, a light emitting section that is provided on the substrate and includes a group of columnar sections formed of a plurality of columnar sections each including a light emitting layer, a first insulating layer provided on the substrate so as to cover the light emitting section, a second insulating layer provided on the first insulating layer, and a protrusion-shaped section containing the same substance as a substance of which the light emitting section is made, and the protrusion-shaped section protrudes from the substrate toward the first insulating layer but does not protrude toward the second insulating layer beyond an upper surface of the first insulating layer.

According to another aspect of the present disclosure, there is provided a projector including the light emitting apparatus according to the aspect described above.

DESCRIPTION OF EXEMPLARY EMBODIMENTS

An embodiment according to the present disclosure will be described below with reference to the drawings.

Figure 1:
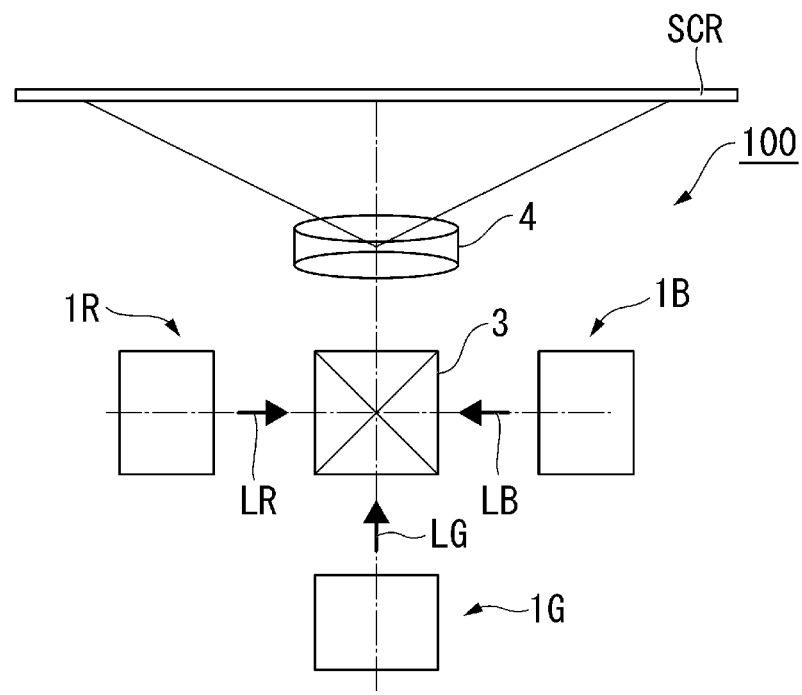
FIG. 1 is a schematic configuration diagram of a projector.

FIG. 1 is a schematic configuration diagram of a projector according to the present embodiment.

In the following drawings, components are drawn at different dimensional scales in some cases for clarification of each of the components.

A projector 100 according to the present embodiment is a projection-type image display apparatus that projects and displays an image on a screen SCR, as shown in FIG. 1. The projector 100 includes light emitting apparatuses 1R, 1G, and 1B, a cross dichroic prism 3, and a projection optical apparatus 4. The configurations of the light emitting apparatuses 1R, 1G, and 1B will be described later.

The light emitting apparatuses 1R, 1G, and 1B emit red light, green light, and blue light, respectively. The light emitting apparatuses 1R, 1G, and 1B can directly form video images by modulating respective light emitting sections as video image pixels in accordance with image information without using, for example, light modulators, such as liquid crystal light valves.

The light emitted from each of the light emitting apparatuses 1R, 1G, and 1B enters the cross dichroic prism 3. The cross dichroic prism 3 combines the light emitted from the light emitting apparatus 1R, the light emitted from the light emitting apparatus 1G, and the light emitted from the light emitting apparatus 1B with one another and guides the combined light to the projection optical apparatus 4. The projection optical apparatus 4 enlarges video images formed by the light emitting apparatuses 1R, 1G, and 1B and projects the enlarged video images on the screen SCR. The projection optical apparatus 4 is formed of a single projection lens or a plurality of projection lenses.

The cross dichroic prism 3 is specifically formed by bonding four right-angled prisms to each other, and a dielectric multilayer film that reflects the red light and a dielectric multilayer film that reflects the blue light are disposed at the inner surfaces of the combined prisms so that the two films form the shape of a cross. The dielectric multilayer films combine the red light, the green light, and the blue light with one another to form light representing a color image. The combined light is then projected by the projection optical apparatus 4, which is a projection system, on the screen SCR, whereby an enlarged image is displayed.

The light emitting apparatuses 1R, 1G, and 1B emit red light LR, green light LG, and blue light LB, respectively. The light emitting apparatuses 1R, 1G, and 1B have the same basic configuration except that the wavelength bands to which the light outputted from the light emitting apparatuses 1R, 1G, and 1B differ from one another. The configuration of the light emitting apparatus 1B will be described below in detail by way of example.

Figure 2:
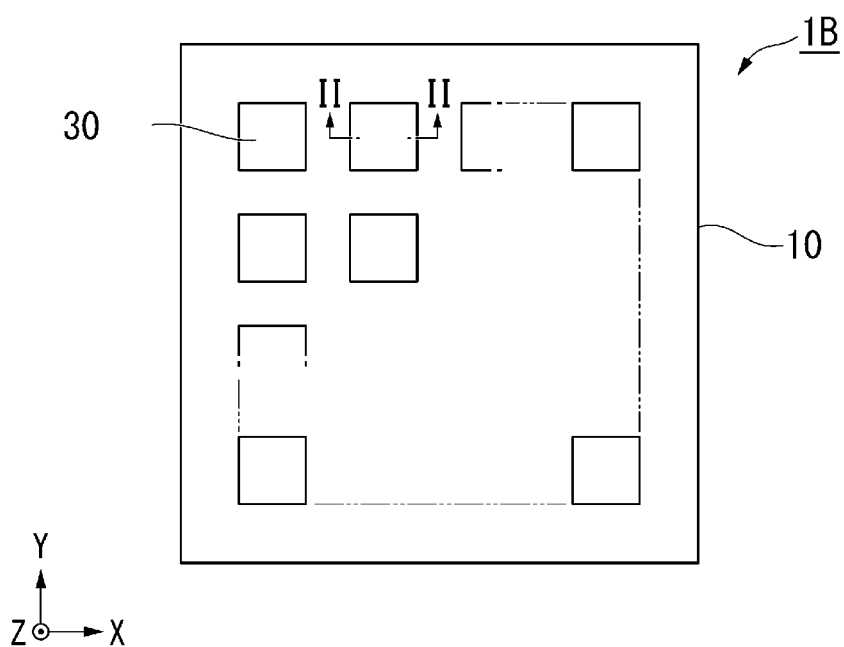
FIG. 2 is a plan view diagrammatically showing the configuration of a light emitting apparatus.

FIG. 2 is a plan view diagrammatically showing the configuration of the light emitting apparatus 1B.

The configuration of each portion of the projector 100 will be described below by using an XYZ orthogonal coordinate system. Axes used in the description are defined as follows: an axis X is an axis parallel to one edge of a light emitting area of the light emitting apparatus 1B, the light emitting area having a rectangular planar shape when viewed in the direction of the optical axis of the light emitting apparatus 1B; an axis Y is an axis parallel to another edge of the light emitting region; and an axis Z is an axis perpendicular to the axes X and Y. The axis Z is parallel to the optical axis of the light emitting apparatus 1B.

The light emitting apparatus 1B includes a plurality of light emitting sections 30 provided in an array as shown in FIG. 2. In the present embodiment, the light emitting sections 30 are provided in a matrix along the axis X or Y. The light emitting apparatus 1B can thus form a self-luminous imager capable of forming video images with the light emitting sections 30 serving as pixels.

Figure 3:
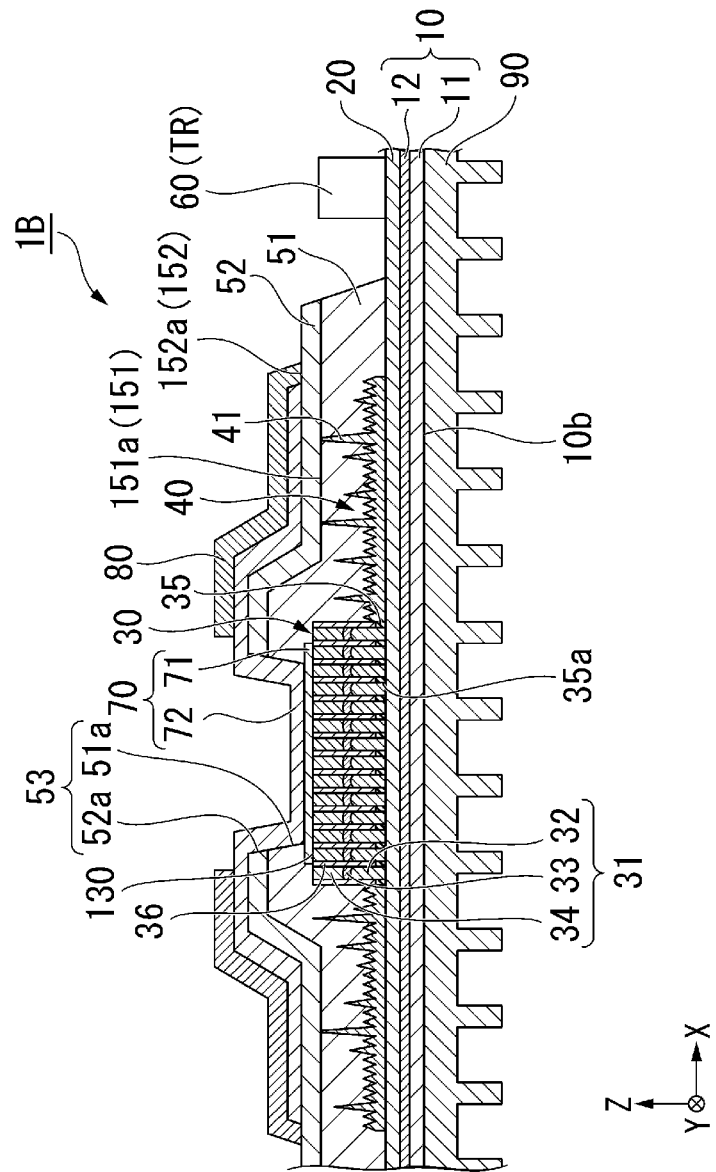
FIG. 3 is a cross-sectional view of the light emitting apparatus taken along the line II-II in FIG. 2.

FIG. 3 is a cross-sectional view showing the configurations of key parts of the light emitting apparatus 1B. FIG. 3 shows the cross-section of the light emitting apparatus 1B taken along the line II-II in FIG. 2.

The light emitting apparatus 1B includes a substrate 10, a semiconductor layer 20, the light emitting sections 30, protrusion-shaped sections 40, a first insulating layer 51, a second insulating layer 52, first electrodes 60, second electrodes 70, wiring lines 80, and a heat sink 90, as shown in FIG. 3. The heat sink 90 is provided at a lower surface 10b of the substrate 10 to dissipate heat generated by the light emitting sections 30. The heat sink 90 may be omitted as required.

In the description of the present embodiment, in the axis-Z direction, the direction in which elements of the laminate that forms the light emitting sections 30 are laminated on the substrate 10 is referred to as a "upward direction", and the direction opposite the direction from the substrate 10 toward the light emitting sections 30 is referred to as a "downward direction".

The substrate 10 includes, for example, a substrate 11 and a reflection layer 12. The substrate 11 is formed, for example, of a silicon (Si) substrate, a gallium nitride (GaN) substrate, or a sapphire substrate. The reflection layer 12 is provided on the substrate 11. The reflection layer 12 is formed, for example, of a laminate in which AlGaN layers and GaN layers are alternately laminated on each other or a laminate in which AlInN layers and GaN layers are alternately laminated on each other. The reflection layer 12 reflects light generated by light emitting layers in the nanocolumns, which will be described below, toward the side opposite from the substrate 11.

The semiconductor layer 20 is provided on the substrate 10. The semiconductor layer 20 is formed, for example, of an n-type GaN layer, specifically, a GaN layer to which Si has been doped.

The light emitting apparatus 1B includes the plurality of light emitting sections 30. The plurality of light emitting sections 30 are formed in the form of islands on the substrate 10 via the semiconductor layer 20 to form a group of light emitting sections (group of columnar sections) on the substrate 10. The light emitting sections 30 adjacent to each other are electrically isolated by a device isolation layer (not shown) provided in a peripheral portion of the semiconductor layer 20. The device isolation layer is formed, for example, of an i-type GaN layer, a silicon oxide layer, or a silicon nitride layer. The light emitting sections 30 are formed in the form of islands in a patterning process using etching.

The light emitting sections 30 each include a plurality of nanocolumns (columnar sections) 31 and light propagation layers 36. The nanocolumns 31 are each a columnar crystal structure that protrudes and extends upward from the semiconductor layer 20. The nanocolumns 31 each have, for example, a polygonal, circular, or elliptical planar shape. In the present embodiment, the nanocolumns 31 each have a quadrangular planar shape, as shown in FIG. 2. The nanocolumns 31 have a diameter in the order of nanometers, specifically, for example, greater than or equal to 10 nm but smaller than or equal to 500 nm. The dimension of the nanocolumns 31 in the lamination direction, what is called a height of the nanocolumns 31, is, for example, greater than or equal to 0.1 μm but smaller than or equal to 5 μm.

In a case where the nanocolumns 31 each have a circular planar shape, the term "the diameter of the nanocolumns 31" refers to the diameter of the circular shape, and in a case where the nanocolumns 31 each have a non-circular planar shape, the term refers to the diameter of the minimum circle containing the non-circular shape therein. For example, in a case where the nanocolumns 31 each have a polygonal planar shape, the diameter of the nanocolumns 31 is the diameter of the minimum circle containing the polygonal shape therein, and in a case where the nanocolumns 31 each have an elliptical planar shape, the diameter of the nanocolumns 31 is the diameter of the minimum circle containing the elliptical shape therein.

In the case where the nanocolumns 31 each have a circular planar shape, the term "the center of each of the nanocolumns 31" refers to the center of the circular shape, and in the case where the nanocolumns 31 each have a non-circular planar shape, the term refers to the center of the minimum circle containing the non-circular shape therein. For example, in the case where the nanocolumns 31 each have a polygonal planar shape, the center of each of the nanocolumns 31 is the center of the minimum circle containing the polygonal shape therein, and in the case where the nanocolumns 31 each have an elliptical planar shape, the center of each of the nanocolumns 31 is the center of the minimum circle containing the elliptical shape therein.

The plurality of nanocolumns 31 are arranged in a predetermined direction at predetermined intervals in the plan view. The nanocolumns 31 can provide a photonic crystal effect and each trap the light emitted by a light emitting layer 33 in the in-plane direction of the substrate 10 and output the light in the lamination direction. The "in-plane direction of the substrate 10" is the direction along the plane perpendicular to the lamination direction.

The nanocolumns 31 each have a first semiconductor layer 32, the light emitting layer 33, and a second semiconductor layer 34, as shown in FIG. 3. The layers that form each of the nanocolumns 31 are each formed by epitaxial growth, as will be described later.

The first semiconductor layer 32 is provided on the semiconductor layer 20. The first semiconductor layer 32 is provided between the substrate 10 and the light emitting layer 33. The first semiconductor layer 32 is formed, for example, of an n-type GaN layer to which Si has been doped. In the present embodiment, the first semiconductor layer 32 is made of the same material as that of the semiconductor layer 20.

The light emitting layer 33 is provided on the first semiconductor layer 32. The light emitting layer 33 is provided between the first semiconductor layer 32 and the second semiconductor layer 34. The light emitting layer 33 has a quantum well structure formed, for example, of a GaN layer and an InGaN layer. The light emitting layer 33 emits light when electric current is injected thereinto via the first semiconductor layer 32 and the second semiconductor layer 34. The numbers of GaN layers and InGaN layers that form the light emitting layer 33 are each not limited to a specific number.

In the present embodiment, the light emitting layer emits, for example, blue light that belongs to a blue wavelength band from 430 nm to 470 nm.

The second semiconductor layer 34 is provided on the light emitting layer 33. The second semiconductor layer 34 differs from the first semiconductor layer 32 in terms of conductivity type. The second semiconductor layer 34 is formed, for example, of a p-type GaN layer to which Mg has been doped. The first semiconductor layer 32 and the second semiconductor layer 34 each function as a cladding layer having the function of confining the light in the light emitting layer 33.

The light propagation layer 36 is provided so as to surround the nanocolumn 31 in the plan view. The refractive index of the light propagation layer 36 is smaller than the refractive index of the light emitting layer 33. The light propagation layer 36 is, for example, a GaN layer or a titanium oxide ($TiO_2$) layer. The GaN layer, which is the light propagation layer 36, can be of i-type, n-type, or p-type. The light propagation layer 36 allows the light generated in the light emitting layer 33 to propagate in the planar direction.

In each of the light emitting sections 30, the laminate of the p-type second semiconductor layer 34, the light emitting layer 33, into which no impurity has been doped, and the n-type first semiconductor layer 32 forms a pin diode. The bandgap of each of the first semiconductor layer 32 and the second semiconductor layer 34 is wider than the bandgap of the light emitting layer 33. In the light emitting section 30, when a forward bias voltage for the pin diode is applied to the space between the first electrode 60 and the second electrode 70 so that current is injected into the pin diode, electrons and holes recombine with each other in the light emitting layer 33. The recombination causes light emission.

The first semiconductor layer 32 and the second semiconductor layer 34 cause the light generated in the light emitting layer 33 to propagate through the light propagation layer 36 in the in-plane direction of the substrate 10. In this process, the photonic crystal effect provided by the nanocolumns 31 causes the light to form a standing wave, which is confined in the in-plane direction of the substrate 10. The confined light receives gain in the light emitting layer 33 and undergoes laser oscillation. That is, the nanocolumns 31 cause the light generated in the light emitting layer 33 to resonate in the in-plane direction of the substrate 10, resulting in laser oscillation. Specifically, the light generated in the light emitting layer 33 resonates in the in-plane direction of the substrate 10 in a resonant section formed by the plurality of nanocolumns 31, resulting in laser oscillation. The +1st-order diffracted light and the −1st-order diffracted light generated by the resonance then travel as laser light in the lamination direction (axis-Z direction).

In the light emitting apparatus 1B, the refractive indices and thicknesses of the first semiconductor layers 32, the second semiconductor layers 34, and the light emitting layers 33 are so designed that the intensity of the light propagating in the planar direction is maximized in the light emitting layer 33 in the axis-Z direction.

In the present embodiment, out of the laser light that travels in the lamination direction, the laser light that travels toward the substrate 10 is reflected off the reflection layer 12 and travels toward the second electrodes 70. The light emitting sections 30 can thus emit the light via the side facing the second electrodes 70.

An insulating layer 35 is provided on the semiconductor layer 20 as shown in FIG. 3. The insulating layer 35 is provided between the light propagation layers 36 and the semiconductor layer 20. The insulating layer 35 functions as a mask for growing the films that form the nanocolumns 31 in the process of manufacturing the light emitting sections 30. The insulating layer 35 is formed, for example, of a silicon oxide layer or a silicon nitride layer.

The first insulating layer 51 is provided on the substrate 10 (semiconductor layer 20) so as to cover the light emitting sections 30. The first insulating layer 51 is, for example, a silicon oxide layer. The first insulating layer 51 has the function of planarizing the upper surface of the substrate 10 and protecting the light emitting sections 30 from impact and other external influences. The first insulating layer 51 has openings 51a, which expose the upper side of the light emitting sections 30.

The protrusion-shaped sections 40 are provided on the second semiconductor layers 20. Although will be described later in detail, the light emitting sections 30 are formed in the form of islands in a patterning process using etching. The protrusion-shaped sections 40 are a residue component produced when the light emitting sections 30 are etched. The protrusion-shaped sections 40 as the etching residue are therefore made of the same substances as those of which the light emitting sections 30 are made. The substances of which the light emitting sections 30 are made are, for example, substances containing at least any of the materials of which the first semiconductor layers 32, the light emitting layers 33, and the second semiconductor layers 34 are made.

The first insulating layer 51 is so formed that the height of an upper surface 151 at the portions that cover the light emitting sections 30 differs from the height of the upper surface 151 at the portion that covers the portion other than the light emitting sections 30. Although will be described later in detail, the tips of part of the protrusion-shaped sections 40, which protrude upward from the first insulating layer 51, are removed in an etching process described later.

First upper surfaces 151a, which are located at a height closest to the substrate 10 out of the upper surface 151 of the first insulating layer 51, is therefore lower than upper surfaces 130 of the light emitting sections 30. The thus formed protrusion-shaped sections 40 protrude from the substrate 10 only into the first insulating layer 51 but does not protrude beyond the upper surface 151 of the first insulating layer 51. As a result, the first insulating layer 51 is not likely to be affected by the shape of the protrusion-shaped sections 40 and therefore has a highly flat surface as the upper surface 151.

The second insulating layer 52 is formed on the first insulating layer 51. In the light emitting apparatus 1B according to the present embodiment, the protrusion-shaped sections 40 are provided so as to protrude from the substrate 10 toward the first insulating layer 51 but as not to protrude into the second insulating layer 52. Since the second insulating layer 52 is formed on the upper surface 151 of the first insulating layer 51, which is not affected by the protrusion-shaped sections 40 and therefore has a high degree of flatness, the second insulating layer 52 itself is also a highly flat layer.

In the present embodiment, the second insulating layer 52 is formed of a silicon oxide layer, which is made of the same material as that of the first insulating layer 51. The manufacturing cost of the light emitting apparatus 1B can thus be reduced by forming the second insulating layer 52 and the first insulating layer 51 with the same material.

The second insulating layer 52 further covers the first insulating layer 51 to increase the thickness of the insulating layer, whereby the planarization and impact protection functions described above can be improved. The second insulating layer 52 has openings 52a, which expose the upper side of the light emitting sections 30. The openings 52a in the second insulating layer 52 communicate with the openings 51a in the first insulating layer 51 to form contact holes 53.

The second insulating layer 52 is so formed that the height of an upper surface 152 in the portions that cover the light emitting sections 30 differs from the height of the upper surface 152 in the portion that covers the portion other than the light emitting sections 30. Specifically, a second upper surface 152a, which is located at a height closest to the substrate 10 out of the upper surface 152 of the second insulating layer 52, is higher than the upper surfaces 130 of the light emitting sections 30. The configuration described above allows a highly flat surface to be formed on the substrate 10 with the thickness of the second insulating layer being thin. The configuration described above is not necessarily employed, and the second upper surface 152a, which is located at a height closest to the substrate 10 out of the upper surface 152 of the second insulating layer 52, may be lower than the upper surfaces 130 of the light emitting sections 30.

The second insulating layer 52 may be made of a material different from that of the first insulating layer 51. Forming the first insulating layer 51 and the second insulating layer 52 with different materials can achieve a configuration in which the dielectric constant of the second insulating layer 52 is lower than that of the first insulating layer 51. The exterior of the first insulating layer 51 can thus be covered with the second insulating layer 52 having more excellent insulation properties. The reliability of the light emitting apparatus 1B can therefore be improved by enhancing the insulation of the light emitting sections 30.

The first electrodes 60 are provided on the semiconductor layer 20 via the insulating layer 35 on the side facing the light emitting sections 30. The first electrodes are provided in correspondence with the light emitting sections 30 and electrically coupled to the light emitting sections 30. The first electrodes 60 form, for example, part of transistors TR provided in correspondence with the light emitting sections 30, for example, the gate electrodes of the transistors TR, and can control the amount of current to be injected into the nanocolumns 31.

The first electrodes 60 may be in ohmic contact with the semiconductor layer 20. In the example shown in FIG. 3, the first electrodes 60 are electrically coupled to the first semiconductor layers 32 via the semiconductor layer 20. The first electrodes 60 are each one of the electrodes for injecting the current into the light emitting layers 33. The first electrodes 60 are each, for example, be a metal layer made, for example, of Ni, Ti, Cr, Pt, or Au or a laminated metal film formed of layers made of the elements described above.

The second electrodes 70 are provided on the light emitting sections 30. The second electrodes 70 are each the other one of the electrodes for injecting the current into the light emitting layers 33.

The second electrodes 70 are formed of a plurality of second electrodes 70 in accordance with the number of light emitting sections 30. The second electrodes 70 each include a contact layer 71 and a transparent electrically conductive layer 72. The contact layer 71 is provided so as to be in contact with part of the nanocolumns 31 and the light propagation layers 36. The contact layer 71 is exposed in the corresponding contact hole 53 provided in the first insulating layer 51 and the second insulating layer 52.

The contact layer 71 is, for example, a metal layer made, for example, of Ni, Ti, Cr, Pt, or Au or a laminated metal film formed of layers made of the elements described above. The contact layer 71 is a layer for improving the electrical conductivity between the second electrode 70 and the light emitting section 30. The contact layer 71 is a thin film having a thickness of about several tens of nanometers and therefore transmits light.

The transparent electrically conductive layer 72 is coupled to the contact layer 71 provided in the contact hole 53. The transparent electrically conductive layer 72 is routed around over the second insulating layer 52 via the contact hole 53.

The transparent electrically conductive layer 72 is, for example, an ITO (indium tin oxide) layer or an IZO (indium zinc oxide) layer. The light generated in the light emitting layer 33 passes through the contact layer 71 and the transparent electrically conductive layer 72 and exits out of the light emitting apparatus.

The wiring lines 80 are laminated on the transparent electrically conductive layer 72. The wiring lines 80 are electrically coupled to the second semiconductor layers 34 in the nanocolumns 31 in the light emitting sections 30 via the second electrode 70. The wiring lines 80 are formed, for example, of a metal layer made, for example, of Ni, Ti, Cr, Pt, or Au or a laminated metal film formed of layers made of the elements described above.

The wiring lines 80 are coupled, for example, via wires, to a drive circuit provided in an area that is not shown on the substrate 10. The first electrodes 60 described above are coupled, for example, via wires, to the drive circuit in the area that is not shown on the substrate 10. Based on the configuration described above, the light emitting apparatus 1B can inject current into the light emitting layers 33 via the first electrodes 60 and the second electrodes 70 by driving the drive circuit.

In the light emitting apparatus 1B according to the present embodiment, the upper surface 152 of the second insulating layer 52, which is configured to be unlikely to be affected by the protrusion-shaped sections 40, can be formed of a flat surface. Short circuits are therefore unlikely to occur in the second electrodes 70 or the wiring lines 80 formed on the second insulating layer 52, whereby the reliability of the electrical coupling can be improved.

In the light emitting apparatus 1B according to the present embodiment, the transistors TR (first electrodes 60) and the light emitting sections 30 can be formed on the same substrate (on one base 10). The size of the light emitting apparatus 1B can thus be reduced as compared with a case where the transistors TR and the light emitting sections 30 are provided on separate substrates.

A method for manufacturing the light emitting apparatus 1B according to the present embodiment will be subsequently described.

FIGS. 4A to 4E show key parts in the steps of manufacturing the light emitting apparatus 1B.

Figure 4A:
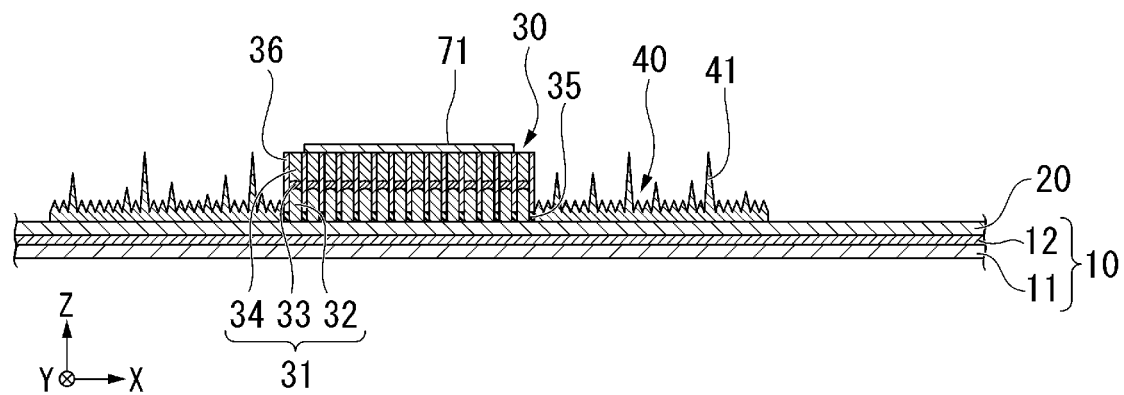
FIG. 4A shows key parts in one of the steps of manufacturing the light emitting apparatus.

First, the step of forming the light emitting sections 30 each including the light emitting layer 33 in the form of islands on the substrate 10 is carried out, as shown in FIG. 4A.

In the step of forming the light emitting sections 30, the semiconductor layer 20 is first epitaxially grown in a predetermined area on the substrate 10. Examples of the epitaxial growth method may include the MOCVD (metal organic chemical vapor deposition) method and the MBE (molecular beam epitaxy) method.

The plurality of nanocolumns 31 are then formed over the entire surface of the semiconductor layer 20. The light propagation layer 36 is subsequently formed around each of the nanocolumns 31. The contact layer 71, which is part of the second electrodes 70, is subsequently formed on the nanocolumns 31.

After the plurality of nanocolumns 31 and light propagation layers 36 are formed on the semiconductor layer 20, the unnecessary nanocolumns 31 and light propagation layers 36 formed in the area other than the area where the light emitting sections 30 are formed are removed in a dry etching process using, for example, a Cl-based etching gas. The light emitting sections 30 are thus formed in the form of islands on the semiconductor layer 20.

Specifically, to form the nanocolumns 31, the insulating layer 35 is formed on the semiconductor layer 20. The insulating layer 35 is formed, for example, by deposition using the CVD (chemical vapor deposition) or the sputtering method and patterning using photolithography and etching (hereinafter also simply referred to as "patterning").

The insulating layer 35 with openings formed therein can be used as a mask to form the nanocolumns 31 by epitaxially growing the first semiconductor layers 32, the light emitting layers 33, and the second semiconductor layers 34 in this order on the semiconductor layer 20, for example, by using the MOCVD method or the MBE method.

After the formation of the nanocolumns 31, the light propagation layer 36 is formed around each of the nanocolumns 31, and the contact layers 71 are formed on the nanocolumns 31 and the light propagation layers 36. The light propagation layers 36 are formed, for example, by using an ELO (epitaxial lateral overgrowth) method using the MOCVD or MBE method. The contact layer 71 is formed, for example, by film formation using sputtering or vacuum evaporation, and patterning.

The aforementioned process of etching the light emitting sections 30 forms the protrusion-shaped sections 40, which are formed of the residue produced when the light emitting sections 30 are etched, on the semiconductor layer 20. The protrusion-shaped sections 40 contain the same substances as those of which the light emitting sections 30 are made, for example, at least any of the substances of which the first semiconductor layer 32, the light emitting layer 33, and the second semiconductor layer 34 are made.

The protrusion-shaped sections 40 are the residue of columnar structures, such as the nanocolumns 31 and the light propagation layers 36, and therefore each have a shape extending upward from the substrate 10. The uppermost protruding portions of the protrusion-shaped sections 40 are flush with the upper ends of the nanocolumns 31 or light propagation layers 36.

Figure 4B:
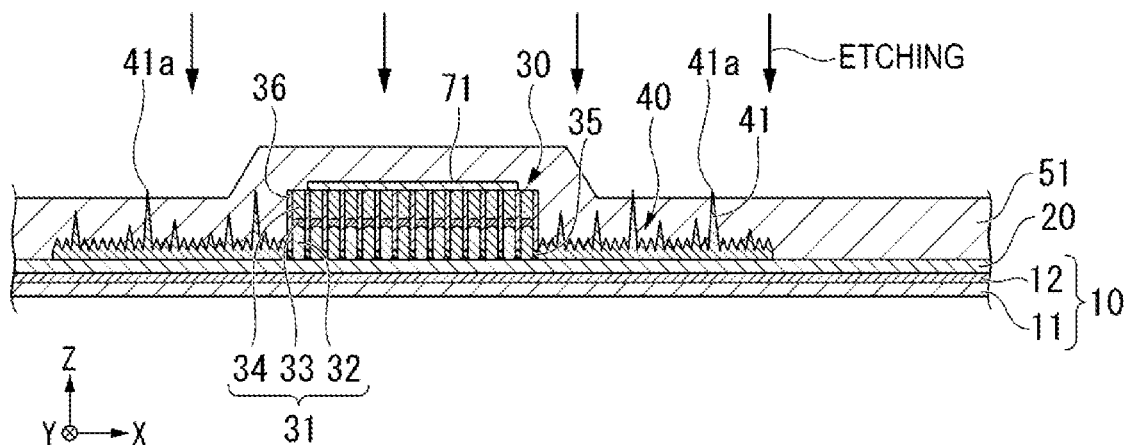
FIG. 4B shows key parts in one of the steps of manufacturing the light emitting apparatus.

After the light emitting sections 30 are formed in the form of islands on the semiconductor layer 20, the first insulating layer 51 is formed on the substrate 10 so as to cover the light emitting sections 30, as shown in FIG. 4B. The first insulating layer 51 is formed, for example, by film formation using spin coating.

The upper surface of a portion of the first insulating layer 51 that is the portion provided in the area different from the light emitting sections 30 is lower than the upper surfaces of the light emitting sections 30. The relatively high tips of the protrusion-shaped sections 40, specifically, tips 41a of protrusions 41 therefore protrude beyond the first insulating layer 51.

Figure 4C:
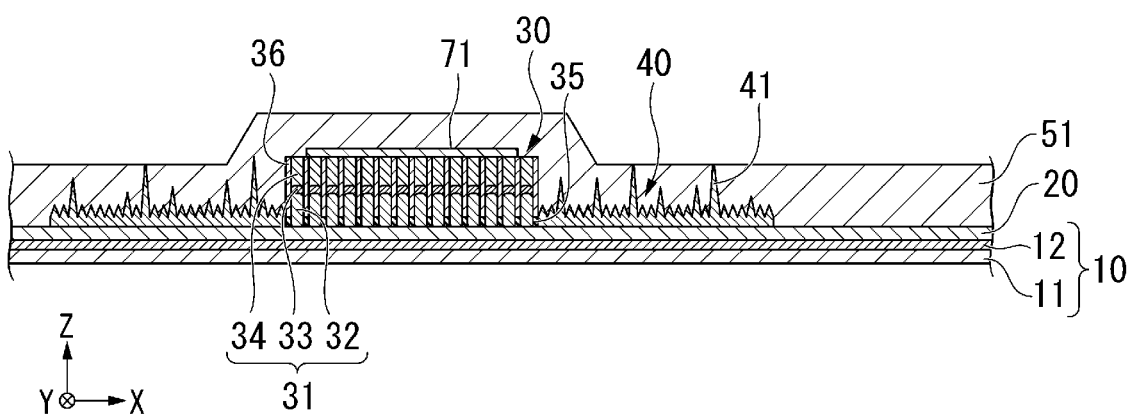
FIG. 4C shows key parts in one of the steps of manufacturing the light emitting apparatus.

The entire upper surface of the first insulating layer 51 is subsequently etched, as shown in FIG. 4C. The tips 41a of the protrusions 41 of the protrusion-shaped sections 40, which protrude beyond the first insulating layer 51, are thus etched away.

The description with reference to FIG. 4A has been made with reference to the case where the step of forming the light emitting sections 30 in the form of islands on the semiconductor layer 20 is the step of patterning away part of the nanocolumns 31 and the light propagation layers 36 formed on the semiconductor layer 20. The following different step can instead be employed as the method for forming the light emitting sections 30 in the form of islands.

For example, the light emitting sections 30 may be formed in the form of islands by forming openings 35a only in areas of the insulating layer 35 that correspond to the areas where the light emitting sections 30 are formed but forming no opening 35a in an area of the insulating layer 35 that corresponds to the area where no light emitting section 30 is formed to form the plurality of nanocolumns 31 and light propagation layers 36 in the areas where the openings 35a are formed.

In this process, protrusion-shaped sections may be disadvantageously formed in an area of the insulating layer 35 that is the area where no light emitting section 30 is formed. The protrusion-shaped sections formed in the area where no light emitting section 30 is formed may disadvantageously protrude beyond the first insulating layer 51.

Since the protrusion-shaped sections are formed by the epitaxial growth of the nanocolumns 31 and the light propagation layers 36, the sections protruding beyond the first insulating layer 51 can be removed by the etching step shown in FIG. 4C, as the protrusion-shaped sections 40 described above can. That is, in the present embodiment, the light emitting sections 30 may be formed in the form of islands by forming the openings 35a only in the areas of the insulating layer 35 that correspond to the areas where the light emitting sections 30 are formed.

Figure 4D:
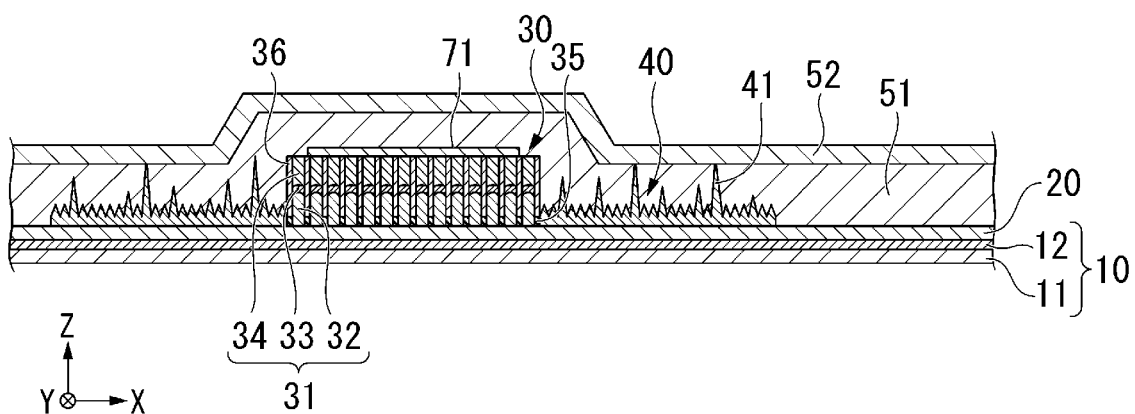
FIG. 4D shows key parts in one of the steps of manufacturing the light emitting apparatus.

The second insulating layer 52 is subsequently formed on the etched first insulating layer 51, as shown in FIG. 4D. The second insulating layer 52 is formed, for example, by film formation using spin coating. In the present embodiment, the second insulating layer 52 is made of the same material as that of the first insulating layer 51. In this case, a material application apparatus can be shared in the formation of the second insulating layer 52 and the first insulating layer 51, allowing reduction in the manufacturing cost.

The second insulating layer 52 can instead be formed by using a material different from the material of the first insulating layer 51. In this case, the dielectric constant of the material of which the second insulating layer 52 is made is desirably lower than the dielectric constant of the material of which the second insulating layer 52 is made. A configuration in which the dielectric constant of the second insulating layer 52 is lower than that of the first insulating layer 51 can thus be achieved. A configuration that allows an increase in the insulation of the light emitting sections 30 can thus be achieved by covering the exterior of the first insulating layer 51 with the second insulating layer 52 having more excellent insulation properties.

Figure 4E:
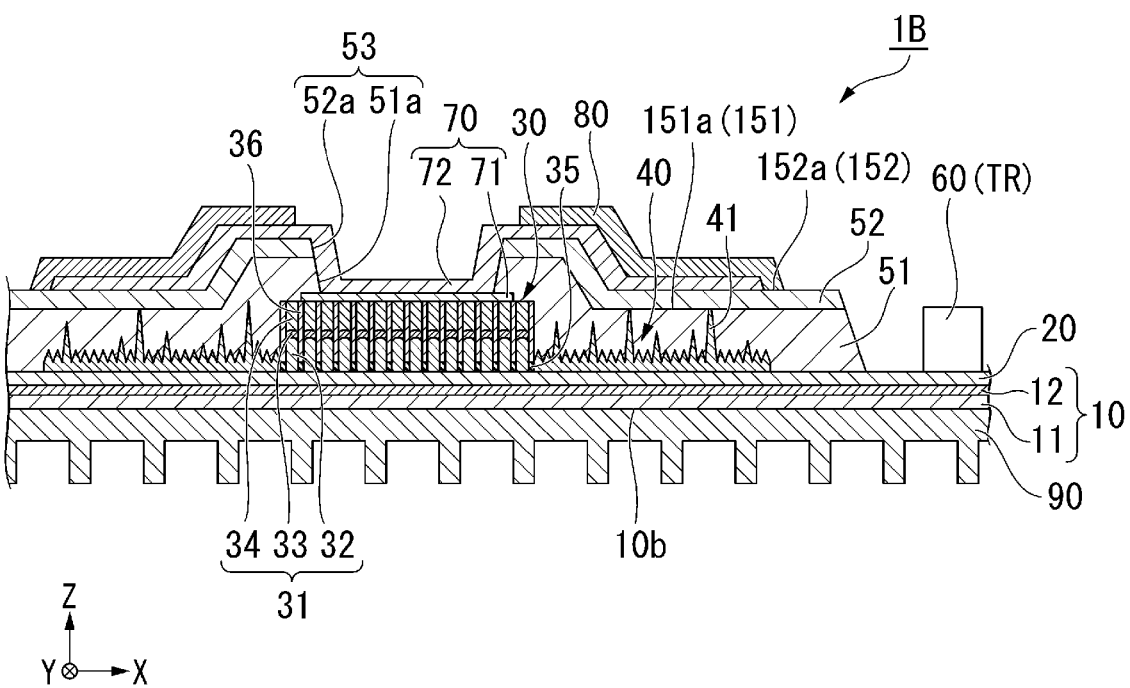
FIG. 4E shows key parts in one of the steps of manufacturing the light emitting apparatus.

Electrodes to be electrically coupled to the light emitting sections 30 are then formed on the second insulating layer 52, as shown in FIG. 4E. Specifically, the first insulating layer 51 and the second insulating layer 52 are collectively patterned into a predetermined shape. In this process, the contact holes 53 are formed so as to expose the upper side of the light emitting sections 30 by forming the openings 51a in the first insulating layer 51 and the openings 52a in the second insulating layer 52.

The transparent electrically conductive layer 72 is then formed on the contact layer 71 exposed in each of the contact holes 53. The transparent electrically conductive layer 72 is formed, for example, by film formation using sputtering or vacuum evaporation, and patterning. The second electrodes 70, which are electrically coupled to the light emitting sections 30, are thus formed. The wiring lines 80 are subsequently formed on the second electrodes 70. The wiring lines 80 are formed, for example, by film formation using sputtering or vacuum evaporation, and patterning.

The first electrodes 60 are subsequently formed in areas different from the areas where the light emitting sections 30 are formed. The first electrodes 60 are formed, for example, by film formation using sputtering or vacuum evaporation, and patterning. The order of the step of forming the second electrodes 70 and the wiring lines 80 and the step of forming the first electrodes 60 is not limited to a specific order.

Finally, the drive circuit is mounted on the substrate 11, for example, by using a bonding member (not shown), and the drive circuit is electrically coupled to the first electrodes 60 and the second electrodes 70 of the light emitting sections 30, for example, by wires. The light emitting apparatus 1B according to the present embodiment is manufactured by attaching the heat sink 90 to the lower surface 10b of the substrate 10.

Effects of the Present Embodiment

As described above, the method for manufacturing the light emitting apparatus 1B according to the present embodiment includes the step of forming the light emitting sections 30, which each include the plurality of nanocolumns 31 each including the light emitting layer 33, in the form of islands on the substrate 10, the step of forming the first insulating layer 51 on the substrate 10 so as to cover the light emitting sections 30, the step of etching the tips 41a of the protrusion-shaped sections 40 (protrusions 41), which contain the same substances as those of which the light emitting sections 30 are made and protrude beyond the first insulating layer 51, the step of forming the second insulating layer 52 on the first insulating layer 51, and the step of forming the second electrodes 70, which are electrically coupled to the light emitting sections 30, on the second insulating layer 52.

According to the method for manufacturing the light emitting apparatus 1B according to the present embodiment, the protrusion-shaped sections 40 can be formed without protruding into the second insulating layer 52 by etching the tips 41a of the protrusions 41 of the protrusion-shaped sections 40, which protrude beyond the first insulating layer 51. The upper surface 152 of the second insulating layer 52 is thus unlikely to be affected by the protrusion-shaped sections 40 and is therefore formed of a flat surface. Short circuits are therefore unlikely to occur in the second electrodes 70 or the wiring lines 80 formed on the second insulating layer 52, whereby the light emitting apparatus 1B having improved reliability of the electrical coupling can be manufactured.

In the method for manufacturing the light emitting apparatus 1B according to the present embodiment, the first insulating layer 51 and the second insulating layer 52 may be made of the same material.

The manufacturing cost of the light emitting apparatus 1B can thus be reduced.

In the method for manufacturing the light emitting apparatus 1B according to the present embodiment, the first insulating layer 51 and the second insulating layer 52 may be made of different materials. In this case, the dielectric constant of the material of which the second insulating layer 52 is formed is desirably lower than the dielectric constant of the material of which the first insulating layer 51 is formed.

The reliability of the light emitting apparatus 1B can be further improved by covering the exterior of the first insulating layer 51 with the second insulating layer 52 having more excellent insulation properties to enhance the insulation of the light emitting sections 30.

In the method for manufacturing the light emitting apparatus 1B according to the present embodiment, in the step of forming the light emitting sections 30, the protrusion-shaped sections 40 may be formed as the etching residue produced when the light emitting sections 30 are etched and patterned into islands.

A decrease in electrical coupling reliability caused by the residue produced when the light emitting sections 30 are etched can thus be suppressed.

The light emitting apparatus 1B according to the present embodiment includes the substrate 10, the light emitting sections 30, which are provided in the form of islands on the substrate 10 and each include the plurality of nanocolumns 31 each including the light emitting layer 33, the first insulating layer 51, which is provided on the substrate 10 so as to cover the light emitting sections 30, the second insulating layer 52, which is formed on the first insulating layer 51, and the protrusion-shaped sections 40, which are provided so as to protrude from the substrate 10 toward the first insulating layer 51 but not to protrude into the second insulating layer 52 and contain the same substances as those of which the light emitting sections 30 are made.

According to the light emitting apparatus 1B according to the present embodiment, the protrusion-shaped sections 40 are formed so as not to protrude into the second insulating layer 52, whereby the upper surface 152 of the second insulating layer 52 can be formed of a flat surface. Short circuits are unlikely to occur in the second electrodes 70 or the wiring lines 80 formed on the second insulating layer 52, whereby the light emitting apparatus 1B having improved electrical coupling reliability can be provided.

In the light emitting apparatus 1B according to the present embodiment, the first upper surface 151a, which is located at a height closest to the substrate 10 out of the upper surface 151 of the first insulating layer 51, may be configured to be lower than the upper surfaces 130 of the light emitting sections 30.

The configuration described above is achieved by etching away the tips 41a of the protrusions 41 of the protrusion-shaped sections 40, which protrude beyond the first insulating layer 51. That is, the configuration described above can achieve a structure in which the protrusion-shaped sections 40 do not protrude beyond the upper surface 151 of the first insulating layer 51.

In the light emitting apparatus 1B according to the present embodiment, the second upper surface 152a, which is located at a height closest to the substrate 10 out of the upper surface 152 of the second insulating layer 52, may be configured to be higher than the upper surfaces 130 of the light emitting sections 30.

A highly flat surface can thus be formed on the substrate 10 with the thickness of the second insulating layer 52 being thin.

In the light emitting apparatus 1B according to the present embodiment, the first insulating layer 51 and the second insulating layer 52 may be made of the same material.

The manufacturing cost of the light emitting apparatus 1B can thus be reduced.

In the light emitting apparatus 1B according to the present embodiment, the first insulating layer 51 and the second insulating layer 52 may be made of different materials. In this case, the dielectric constant of the second insulating layer 52 is desirably lower than that of the first insulating layer 51.

The reliability of the light emitting apparatus 1B can be further improved by covering the exterior of the first insulating layer 51 with the second insulating layer 52 having more excellent insulation properties to enhance the insulation of the light emitting sections 30.

In the light emitting apparatus 1B according to the present embodiment, the protrusion-shaped sections 40 may be part of the etching residue produced when the light emitting sections 30 are formed in an etching process.

The light emitting apparatus 1B that allows suppression of a decrease in electrical coupling reliability caused by the residue produced when the light emitting sections 30 are etched can thus be manufactured.

In the above description, the light emitting apparatus 1B has been presented by way of example, and the same effects as those provided by the light emitting apparatus 1B can be provided by the light emitting apparatuses 1R and 1G, which have the same configuration as that of the light emitting apparatus 1B. That is, the light emitting apparatuses 1R and 1G according to the present embodiment also have excellent electrical coupling reliability.

The projector 100 according to the present embodiment includes the light emitting apparatuses 1R, 1G, and 1B.

The projector 100 according to the present embodiment includes the light emitting apparatuses 1R, 1G, 1B, which provide the effects described above and therefore have excellent electrical coupling reliability, and can therefore display reliable and bright video images.

The technical scope of the present disclosure is not limited to the embodiment described above, and a variety of changes can be made thereto to the extent that the changes do not depart from the substance of the present disclosure.

For example, in the case of a light emitting apparatus in which the light emitting section that outputs the red light LR, the light emitting section that outputs the green light LG, and the light emitting section that outputs the blue light LB are provided on the same base 10, the light outputted from the light emitting apparatus does not enter the cross dichroic prism but directly enters the projection optical apparatus 4. In this case, a single light emitting apparatus can display a full-color image, whereby the configuration of the light emitting apparatus can be made more compact.

The aforementioned embodiment has been described with reference to the case where the light emitting layers are made of an InGaN-based material, and the light emitting layers can be made of any of a variety of other semiconductor materials in accordance with the wavelengths of the light to be outputted from the light emitting layers. Examples of the material of the light emitting layers may include an AlGaN-based, AlGaAs-based, InGaAs-based, InGaAsP-based, InP-based, GaP-based, and AlGaP-based semiconductor materials. The diameter of the photonic crystal structures or the intervals at which the photonic crystal structures are arranged may be changed as appropriate in accordance with the wavelengths of the light to be outputted from the light emitting layers.

In addition to the above, the specific descriptions of the shape, the number, the arrangement, the material, and other factors of each component of the light emitting apparatuses and the projector are not limited to those in the embodiment described above and can be changed as appropriate.

The aforementioned embodiment has been described with reference to the case where the light emitting apparatuses according to the present disclosure are incorporated in a projector, but not necessarily. For example, the light emitting apparatuses according to the disclosure are applicable to a micro-LED display, a head mounted display, or a display apparatus of a smartwatch. The light emitting apparatuses according to the present disclosure can be used in a lighting apparatus, a headlight of an automobile, and other products.

A method for manufacturing a light emitting apparatus according to an aspect of the present disclosure may have the configurations below.

A method for manufacturing a light emitting apparatus according to an aspect of the present disclosure includes the step of forming a light emitting section on a substrate, the light emitting section including a group of columnar sections formed of a plurality of columnar sections each including a light emitting layer, the step of forming a first insulating layer on the substrate so as to cover the light emitting section, the step of etching a tip of a protrusion-shaped section that contains the same substance as a substance of which the light emitting section is made and protrudes beyond the first insulating layer, the step of forming a second insulating layer on the first insulating layer, and the step of forming an electrode to be electrically coupled to the light emitting section on the second insulating layer.

In the method for manufacturing the light emitting apparatus according to the aspect of the present disclosure, the first insulating layer and the second insulating layer may be made of the same material.

In the method for manufacturing the light emitting apparatus according to the aspect of the present disclosure, the first insulating layer and the second insulating layer may be made of different material.

In the method for manufacturing the light emitting apparatus according to the aspect of the present disclosure, the dielectric constant of the material of which the second insulating layer is formed may be lower than the dielectric constant of the material of which the first insulating layer is formed.

In the method for manufacturing the light emitting apparatus according to the aspect of the present disclosure, in the step of forming a light emitting section, the protrusion-shaped section may be formed as an etching residue produced when the light emitting section is etched and patterned into an island.

A light emitting apparatus according to another aspect of the present disclosure may have the configuration below.

A light emitting apparatus according to another aspect of the present disclosure includes a substrate, a light emitting section that is provided on the substrate and includes a group of columnar sections formed of a plurality of columnar sections each including a light emitting layer, a first insulating layer provided on the substrate so as to cover the light emitting section, a second insulating layer provided on the first insulating layer, and a protrusion-shaped section containing the same substance as a substance of which the light emitting section is made, and the protrusion-shaped section protrudes from the substrate toward the first insulating layer but does not protrude toward the second insulating layer beyond the upper surface of the first insulating layer.

In the light emitting apparatus according to the aspect of the present disclosure, a first upper surface located at a height closest to the substrate out of the upper surface of the first insulating layer may be configured to be lower than the upper surface of the light emitting section.

In the light emitting apparatus according to the aspect of the present disclosure, a second upper surface located at a height closest to the substrate out of the upper surface of the second insulating layer may be configured to be higher than the upper surface of the light emitting section.

In the light emitting apparatus according to the aspect of the present disclosure, the first insulating layer and the second insulating layer may be made of the same material.

In the light emitting apparatus according to the aspect of the present disclosure, the first insulating layer and the second insulating layer may be made of different materials.

In the light emitting apparatus according to the aspect of the present disclosure, the dielectric constant of the second insulating layer may be lower than the dielectric constant of the first insulating layer.

In the light emitting apparatus according to the aspect of the present disclosure, the protrusion-shaped section may be part of an etching residue produced when the light emitting section is formed in an etching process.

A projector according to another aspect of the present disclosure may have the configuration below.

A projector according to another aspect of the present disclosure includes the light emitting apparatus according to the aspect of the present disclosure.

What is claimed is:

1. A light emitting apparatus comprising:
   a substrate having a first region, a second region, and a third region, the first region and the second region being laterally located next to each other in a cross section, the second region and the third region being laterally located next to each other in the cross section, the first region being laterally sandwiched between the second region and the third region in the cross section;
   a light emitting section that is provided on the substrate and includes a plurality of columnar sections, the plurality of columnar sections being provided only on the first region of the substrate, each of the plurality of columnar sections including a light emitting layer;
   a protrusion-shaped section that is respectively provided only on the second region and the third region of the substrate and contains a same substance as the light emitting section;
   a first insulating layer provided on the substrate including the first, second, and third regions so as to cover the light emitting section and the protrusion-shaped section; and
   a second insulating layer provided on the first insulating layer,
   wherein the protrusion-shaped section protrudes from the substrate into the first insulating layer but does not protrude into the second insulating layer beyond a first upper surface of the first insulating layer, and
   the protrusion-shaped section penetrates into an inside of the first insulating layer.

2. The light emitting apparatus according to claim 1, wherein part of the first upper surface of the first insulating layer is located closer to the substrate than a second upper surface of the light emitting section.

3. The light emitting apparatus according to claim 1, wherein an entirety of a third upper surface of the second insulating layer is located away from the substrate than a second upper surface of the light emitting section.

4. The light emitting apparatus according to claim 1, wherein the first insulating layer and the second insulating layer are made of the same material.

5. The light emitting apparatus according to claim 1, wherein the first insulating layer and the second insulating layer are made of different materials.

6. The light emitting apparatus according to claim 5, wherein a dielectric constant of the second insulating layer is lower than a dielectric constant of the first insulating layer.

7. The light emitting apparatus according to claim 1, wherein the protrusion-shaped section is part of an etching residue produced when the light emitting section is formed in an etching process.

8. A projector comprising the light emitting apparatus according to claim 1.

* * * * *